United States Patent [19]
Landi

[11] Patent Number: 5,057,790
[45] Date of Patent: Oct. 15, 1991

[54] HIGH EFFICIENCY CLASS A AMPLIFIER

[76] Inventor: Ernest D. Landi, 1794 Rocky Mountain Ave., Milpitas, Calif. 94035

[21] Appl. No.: 553,921

[22] Filed: Jul. 16, 1990

[51] Int. Cl.$^5$ .............................................. H03F 3/26
[52] U.S. Cl. ..................................... 330/268; 330/265
[58] Field of Search ............... 330/263, 264, 265, 267, 330/268; 307/490, 492

[56] References Cited
U.S. PATENT DOCUMENTS 3,995,228 11/1976 Pass .................................. 330/268 X
4,520,323 5/1985 Nakayama ............................ 330/268

Primary Examiner—Steven Mottola
Attorney, Agent, or Firm—Skjerven, Morrill, MacPherson, Franklin & Friel

[57] ABSTRACT

An audio amplifier reduces crossover distortion typical of class AB push-pull amplifiers by including means for preventing either of the output transistors from being cut off during any portion of the audio waveform. This desirably eliminates sharp discontinuities associated with the transfer function of the amplifier. The circuit includes two base-emitter voltage multipliers and a nonlinear transconductance feedback amplifier.

10 Claims, 5 Drawing Sheets

$I_{OUT}$ vs. ($V_{IN} - V_{OUT}$) OF CIRCUIT OF FIG. 1

$i_{OUT}$ vs. $(V_{IN} - V_{OUT})$ OF CIRCUIT OF FIG. 3

HIGH EFFICIENCY CLASS A AMPLIFIER

BACKGROUND OF THE INVENTION

1. Field of the Invention

This invention relates to power amplifiers and more specifically to a Class A high fidelity audio amplifier having high efficiency.

2. Description of the Prior Art

Cross-over distortion is a well known disadvantage of "Class AB" push-pull amplifiers caused by abrupt non-linearities in the transfer function. This disadvantage is eliminated by using "Class A" operation in which the output transistors are always operated in their linear operating region. A disadvantage of Class A amplifiers is their low efficiency, since the bias current is usually at least half the peak output current in a push-pull amplifier.

A diagram of the output stage of a prior art class AB push-pull amplifier is shown in FIG. 1. The output stage is shown in a symmetrical configuration. Transistors Q1 and Q2 control current to the output node D. The current is supplied from two voltage sources: a first source V1 having a positive voltage applied to the collector of Q1 (node B) and a second source V2 having a negative voltage applied to the collector of Q2 (node C). The emitters of Q1 and Q2 are both connected to output node D through emitter resistors R1 and R2. Biasing of Q1 and Q2 is supplied by voltage sources V3 and V4. V3 keeps the base of Q1 at a constant positive voltage relative to input node A. Likewise, V4 keeps the base of Q2 at a constant negative voltage relative to input node A. The magnitudes of V3 and V4 are equal, the magnitudes of Vbe1 (base-emitter voltage of Q1) and Vbe2 are equal, and the values of R1 and R2 are equal.

In such a class AB push-pull amplifier, both output transistors Q1, Q2 are biased in their linear active region for small values of output current. In other words, for small signals both transistors are always conducting and operating as a class A amplifier. For large signals output transistors Q1, Q2 will alternately be driven into cutoff. A discontinuity is created in the transfer function of the amplifier at the point of cutoff and this is a form of undesirable crossover distortion.

During no signal conditions, $Vout=Vin$, $Ie1=-Ie2$, and $Iout=Ie1+Ie2=0$. Since Vout=Vin, voltage V3 is dropped across Vbe1 and R1 and the voltage V4 is dropped across Vbe2 and R2. If Vin is raised, the voltage drop across R1 will increase and the voltage drop across R2 will decrease. Current Ie1 will increase and current Ie2 will decrease. The difference in Ie1 and Ie2 will flow out of node D into the load impedance. As Vin continues to rise in the positive direction, Ie1 will increase and Ie2 will decrease until it becomes zero and transistor Q2 is cutoff. Since Q2 cannot reverse the polarity of its emitter current, Ie1 will continue to increase as Ie2 remains at zero. With Q2 cutoff, output current Iout is equal to the emitter current of Q1; Iout=Ie1. If Vin is lowered, Ie1 will decrease until Q1 is cutoff and output current Iout will be equal to the emitter current of Q2; thus Iout=Ie2.

FIG. 2 shows Ie1, Ie2, and Iout as a function of Vin−Vout. At points E and F on the Vin−Vout axis one of the output transistors Q1, Q2 goes into cutoff and the slope of Iout changes. The change in slope of the Iout curve represents a change in the output resistance of the amplifier. If both transistors Q1, Q2 are in the linear active region, the output resistance can be approximated by the parallel combination of R1 and R2. If one of the transistors Q1, Q2 is cutoff, the output resistance increases to the value of just one emitter resistor, either R1 or R2.

One known method to reduce the discontinuity of the Iout curve shown in FIG. 2 and to maintain the efficiency of class AB operation is to prevent either output transistor Q1, Q2 from going into cutoff, yet allowing a low quiescent current during no signal conditions.

Several disclosures apply this principle to a complementary push-pull emitter follower output stage of the type shown in FIG. 1. U.S. Pat. Nos. 4,250,323, 4,558,288, 4,595,883 to Nakayama each disclose use of two auxiliary amplifiers. Each auxiliary amplifier prevents an output transistor from going into cutoff, but by their operation the auxiliary amplifiers themselves include transistors which go into cutoff and effectively disconnect the output transistors from the input signal.

Another technique disclosed by Kawanabe (U.S. Pat. No. 4,215,318) uses two auxiliary amplifiers to adjust instantaneously the bias across both transistors to prevent either from going into cutoff. Both of these auxiliary amplifiers include transistors that by their operation go into cutoff.

Okabe (U.S. Pat. No. 4,274,059) applies feedback to one output transistor at a time. This technique requires diodes which must switch on and off.

Pass (U.S. Pat. No. 3,995,228) also applies feedback to one output transistor at a time. This technique also requires diodes which must switch on and off.

SUMMARY OF THE INVENTION

An object of the invention is to greatly reduce the crossover distortion inherent in prior art Class AB amplifiers. This is accomplished by including in an amplifier (such as a modified Class AB amplifier) means for preventing either of the output transistors from being cutoff during any portion of a waveform. This result is achieved without any other transistors in the circuit being cutoff or saturated during any portion of a waveform. All transistors are operated in their linear active regions at all times. As is known, any deviation from a linear transfer function causes distortion. In general but not universally, a gradual or smooth non-linearity is more desirable than a sharp or discontinuous non-linearity because it is less objectionable to hear and is easier to minimize with feedback. Therefore, advantageously there are no sharp discontinuities associated with any internal transfer functions of the circuit in accordance with the invention.

DETAILED DESCRIPTION OF THE INVENTION

Figure 1:
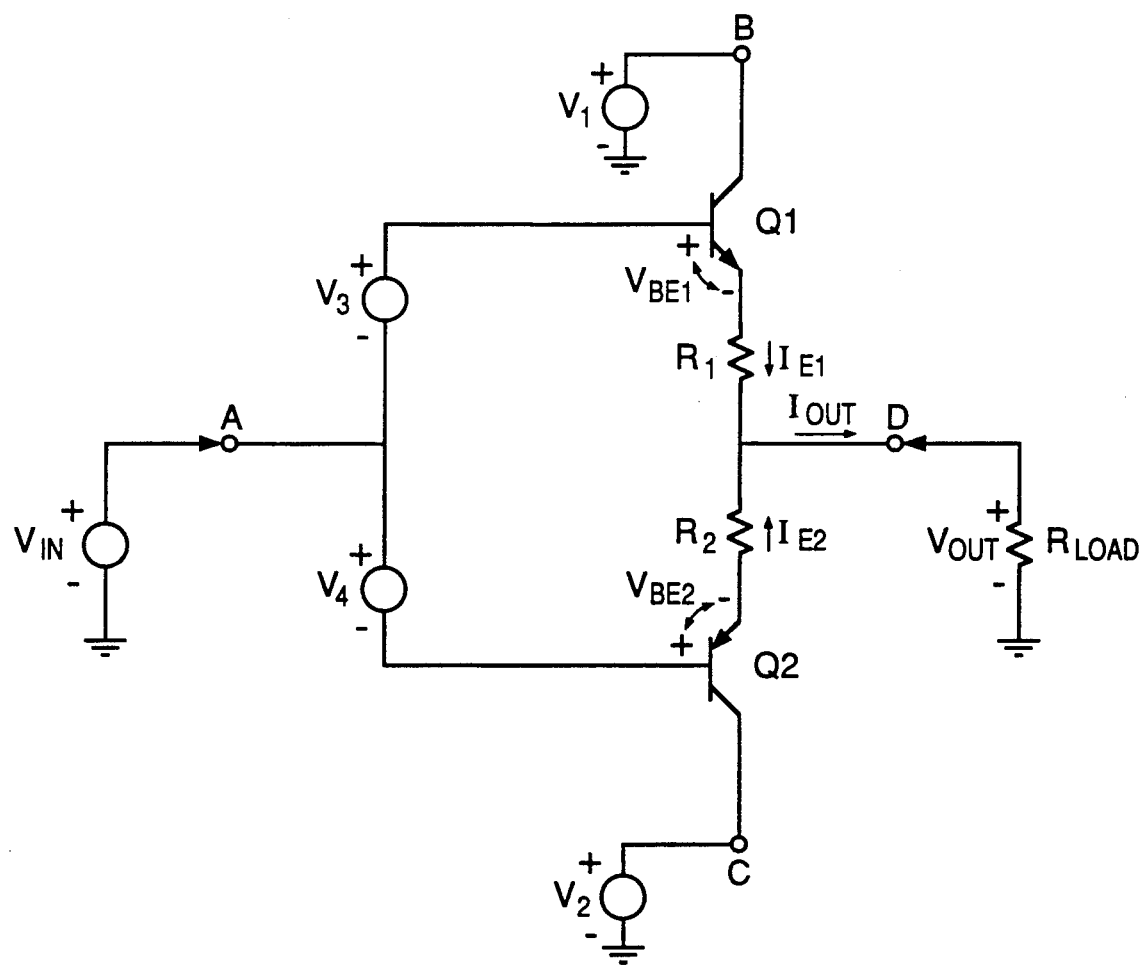
FIG. 1 shows schematically a prior art amplifier.
Figure 2:
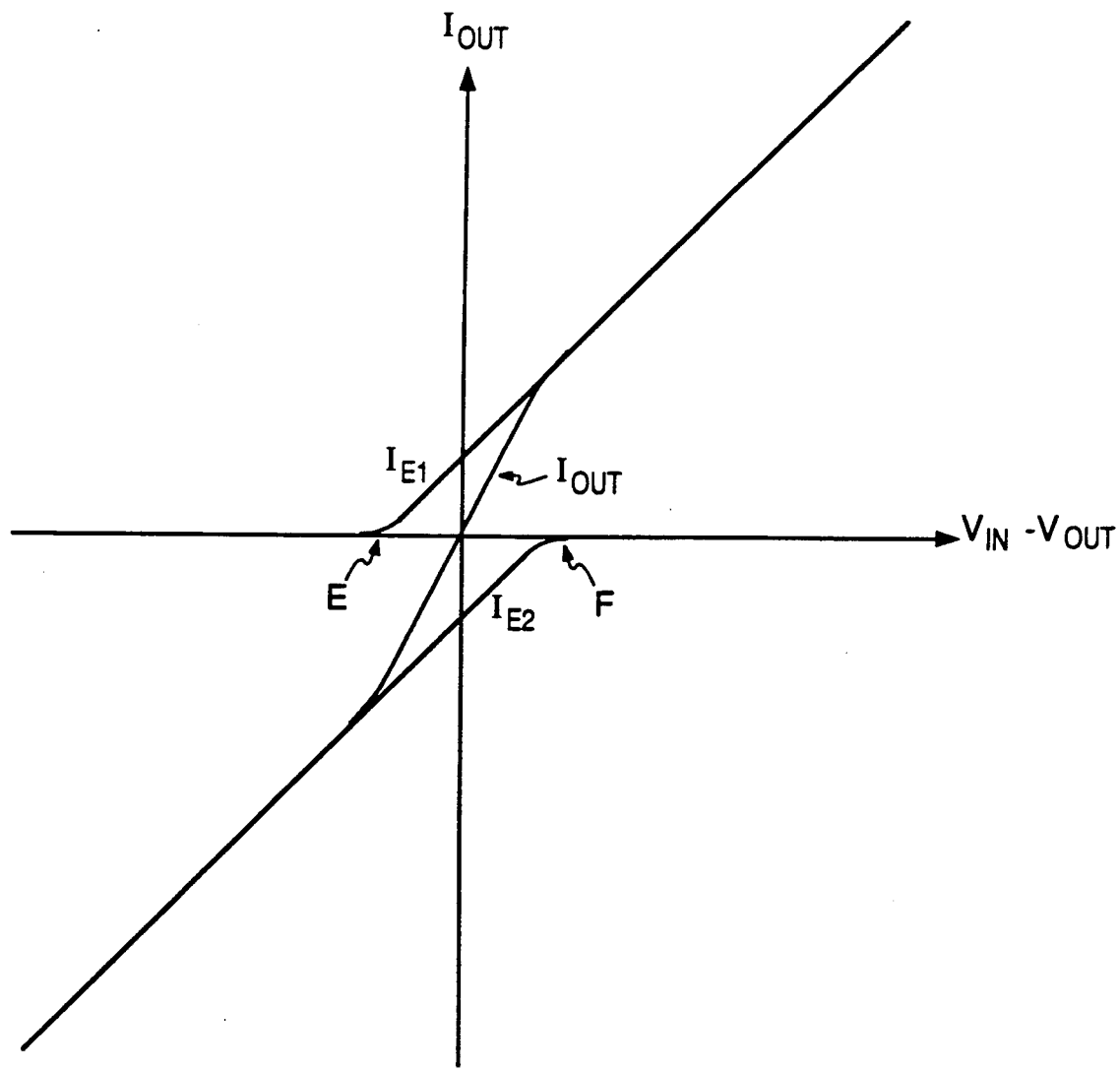
FIG. 2 shows characteristics of the amplifier of FIG. 1.
Figure 3:
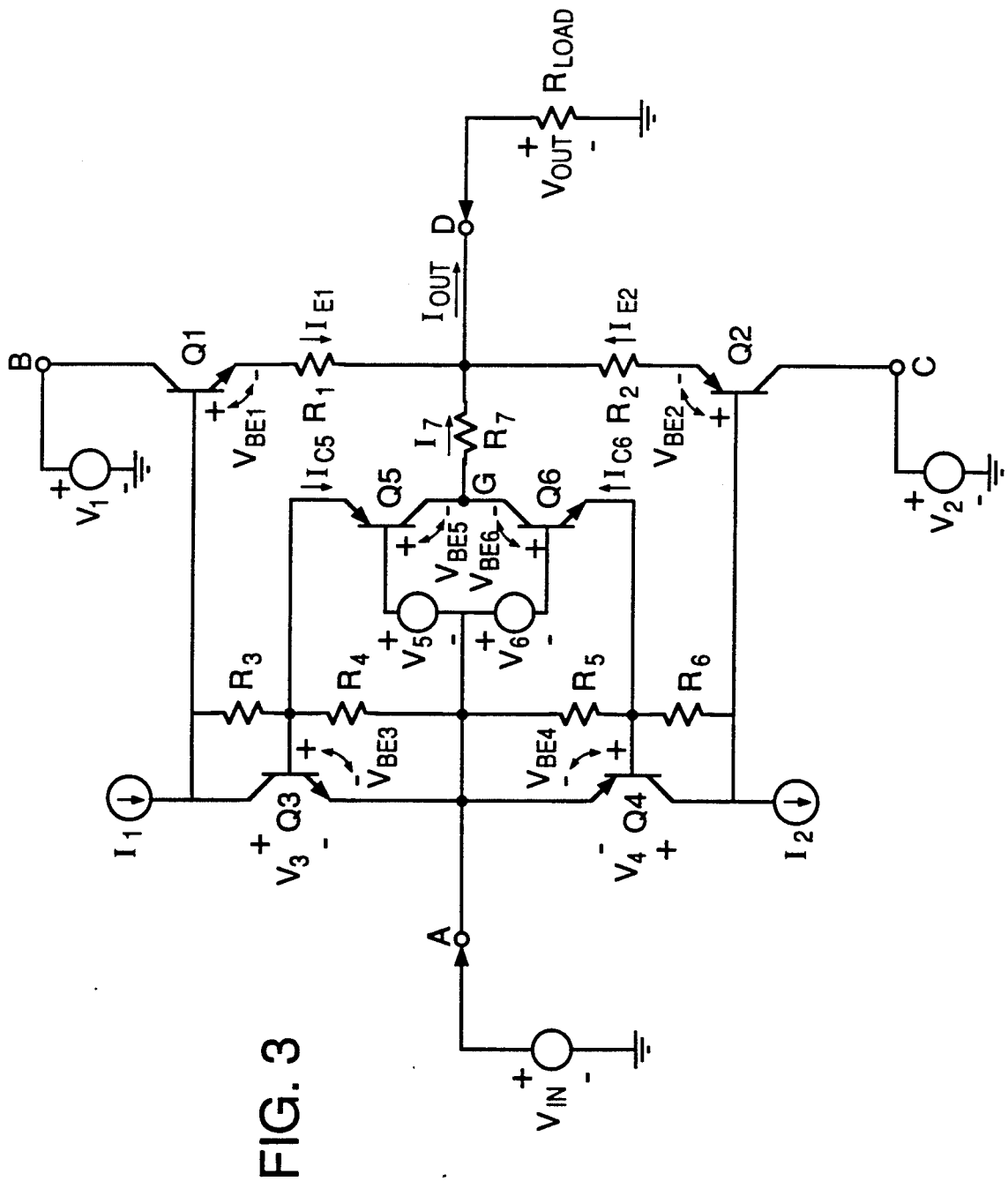
FIG. 3 shows schematically an amplifier in accordance with the invention.

An amplifier in accordance with the invention is shown in FIG. 3. Components common with FIG. 1 are labeled as in FIG. 1. Bipolar transistor Q3, resistors R3 and R4, and current source I1 form a Vbe multiplier configuration to maintain the base of bipolar transistor Q1 at a positive voltage (V3) relative to the input node A. Bipolar transistor Q4, resistors R5 and R6, and current source I2 form a Vbe multiplier configuration to maintain the base of bipolar transistor Q2 at a negative voltage (V4) relative to the input node A. With no signal applied, transistors Q1 and Q2 are biased on with an idling current determined by the value of voltages V3 and V4, the value of resistors R1 and R2, and Vbe1 and Vbe2.

Voltage sources V5, V6, transistors Q5, Q6, and resistor R7 form an amplifier with two outputs, each output having a non-linear transfer function relative to one input. Each output transfer function is a non-linear transconductance, that is, each output is a current controlled by an input voltage. The amplifier including these five components is a feedback amplifier.

Voltage source V5 maintains the base of Q5 at a constant positive voltage (V5) above the input node A. Voltage source V6 maintains the base of Q6 at a constant negative voltage (V6) below input node A. The emitters of Q5 and Q6 are connected together at node G. The collector of Q5 is connected to the base of Q3. The collector of Q6 is connected to the base of Q4.

The input of the feedback amplifier is the voltage between the input node A and the output node D. The outputs of the feedback amplifier are the collector currents of Q5 and Q6, namely Ic5 and Ic6 respectively. Current Ic5 flows through R3, and this has the effect of increasing the magnitude of V3 by the amount Ic5×R3. An increase in the magnitude of V3 will turn Q1 on more, passing more current through R1 into the output node D and increasing the output voltage Vout. Likewise, current Ic6 flows through R6, having the effect of increasing the magnitude of V4, increasing the current through R2 from the output node and decreasing the output voltage Vout.

Figure 4:
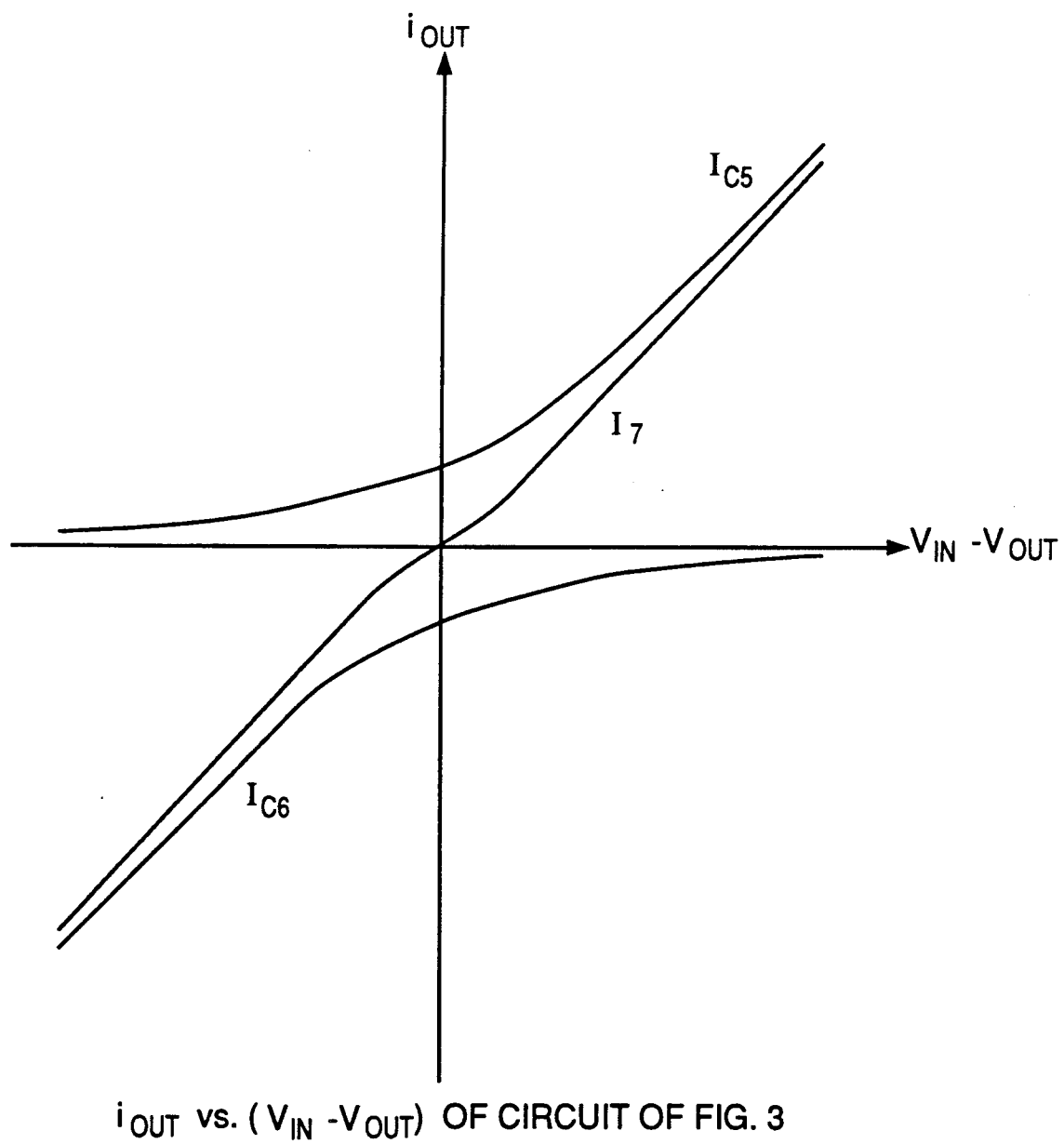
FIG. 4 shows characteristics of the amplifier of FIG. 3.
Figure 5:
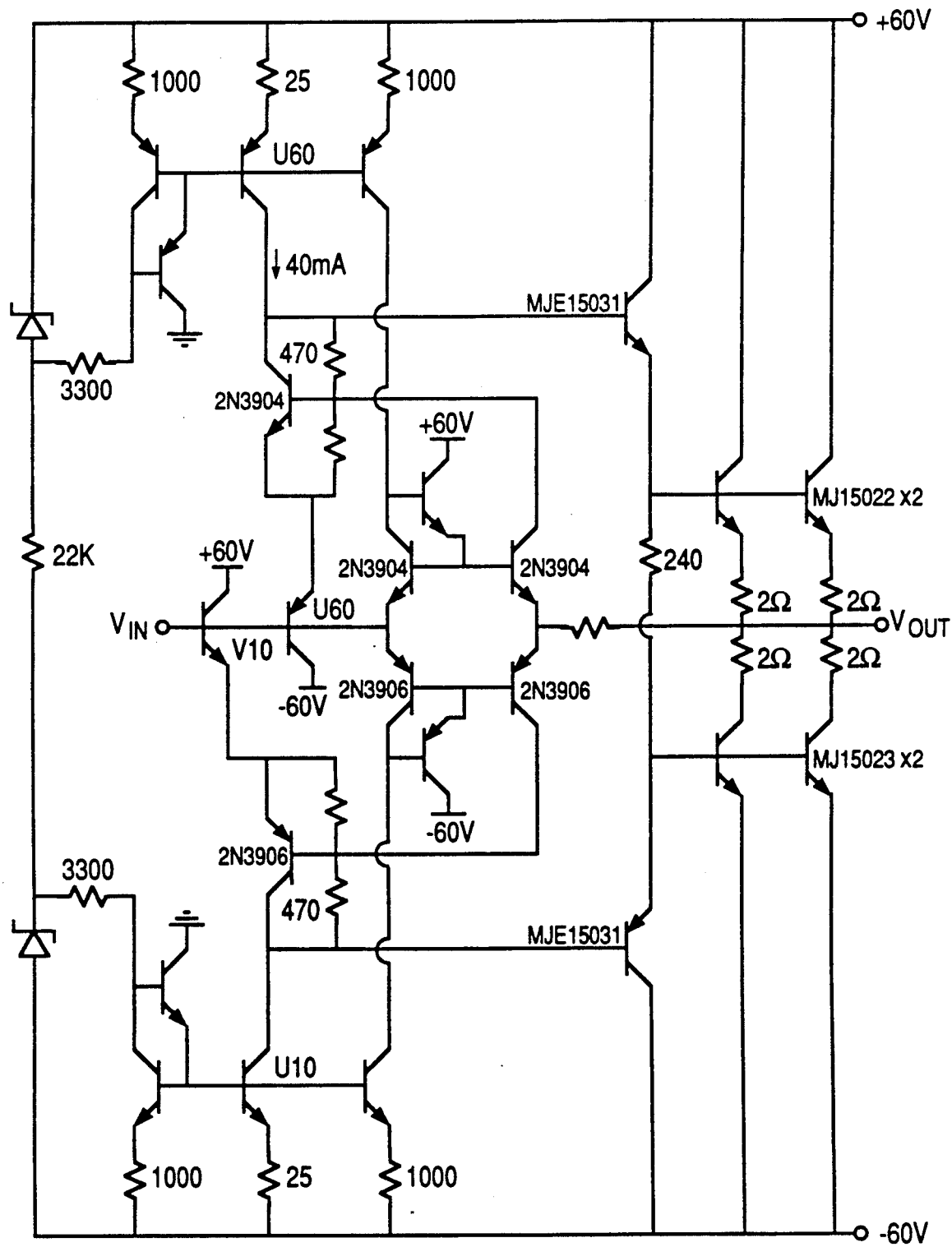
FIG. 5 shows the amplifier of FIG. 3 in more detail.

Voltage sources V5 and V6 keep the base-to-base voltage between transistors Q5 and Q6 constant. Therefore, Vbe5−Vbe6 is also constant since V5−V6=Vbe5−Vbe6. Current Ic5 is approximated by the relation $Ic5 = Is \times exp(Vbe5/Vt)$ and current Ic6 is approximated by the relation $Ic6 = -Is \times exp(-Vbe6/Vt)$, where Is and Vt are functions of temperature. These relations are accurate over many decades of current if Q5 and Q6 are small signal transistors at the same temperature with low intrinsic emitter resistance and low values of collector current. Because the collector current of each transistor is an exponential function of the Vbe of that transistor, and the value of Vbe5−Vbe6 is constant, it follows that the value of Ic5×Ic6 is also a constant. This provides the desirable result (see FIG. 4) that as Ic5 increases to very large values, Ic6 does not decrease to zero but instead approaches zero at an ever decreasing rate. If Ic5 increases by a factor of ten from 0.1 mA to 1.0 mA, Ic6 decreases by a factor of one tenth from 0.1 mA to 0.01 mA. FIG. 5 shows the circuit of FIG. 3 in more detail, including component values and types.

In another embodiment, MOSFETS are used as the output devices in place of bipolar transistors Q1 and Q2 of FIG. 3, with appropriate modifications to the magnitudes of V3, V4, R1, R2, and R7.

The above description of the invention is illustrative and not limiting; further modifications will be apparent to one skilled in the art in the light of this disclosure and the appended claims.

I claim:

1. An amplifier circuit comprising:
   a signal input terminal for receiving an input signal;
   a signal output terminal for providing an output signal;
   a first amplifier having a control terminal, an input terminal, and an output terminal connected to the signal output terminal;
   a second amplifier having a control terminal, an input terminal, and an output terminal connected to the signal output terminal;
   first multiplier means for providing a voltage to the control terminal of the first amplifier more positive than a voltage at the signal input terminal;
   second multiplier means for providing a voltage to the control terminal of the second amplifier more negative than a voltage at the signal input terminal;
   feedback means for providing a first current to the first multiplier means and a second current to the second multiplier means, said first and second currents each being predetermined functions of a difference of a voltage at the signal input terminal and a voltage at the signal output terminal;
   means for connecting the signal input terminal to the feedback means, and to the first and second multiplier means; and
   wherein the voltage provided by the first multiplier means varies in response to the voltage at the signal input terminal and to the first current, and wherein the voltage provided by the second multiplier means varies in response to the voltage at the signal input terminal and to the second current.

2. The device of claim 1, wherein the first and second currents each vary in non-linear fashion relative to the voltage at the signal input terminal.

3. The device of claim 1, wherein the feedback means comprises:
   a first and second voltage source each connected to the signal input terminal; and
   first and second transistors each having a control terminal connected respectively to the first and second voltage sources.

4. The device of claim 1, wherein the first multiplier means comprises:
   a current source;
   a transistor having a control terminal connected to receive the first current, having an input terminal connected to the input signal terminal, and having an output terminal connected to the current source and to the control terminal of the first amplifier.

5. An amplifier circuit comprising:
   an input terminal
   an output terminal;
   a first amplifier connected to provide its output to the output terminal;
   a second amplifier connected to provide its output to the output terminal; and
   control means connected to the input terminal for controlling the outputs of respectively the first and second amplifiers as a function of a difference between a voltage at the input terminal and a voltage at the output terminal, wherein the control means includes a plurality of transistors which operate in their linear active regions at all times, thereby not being cutoff or saturated, and no switching diodes are employed.

6. The device of claim 5, wherein the control means includes means for preventing the first amplifier and the second amplifier from being cut off irrespective of a magnitude of a current at the output terminal.

7. A method of amplifying an input signal by an amplifier to provide an output signal comprising the steps of:
   providing a first amplifier and a second amplifier;
   combining an output of the first amplifier and of the second amplifier to form the output signal; and
   controlling the output of the first amplifier and the output of the second amplifier as a function of an amplitude of the input signal and an amplitude of the output signal, wherein said step of controlling includes the step of operating all transistors in the amplifier in their linear active regions at all times thereby said transistors not being cutoff or saturated, and employing no switching diodes.

8. The method of claim 7, wherein the step of controlling includes the step of preventing the first amplifier and the second amplifier from being cut off irrespective of the amplitude of a magnitude of a current at the output terminal.

9. An amplifier circuit comprising:
   a signal input terminal for receiving an input signal;
   a signal output terminal for providing an output signal;
   a first amplifier having a control terminal, an input terminal, and an output terminal connected to the signal output terminal;
   a second amplifier having a control terminal, an input terminal, and an output terminal connected to the signal output terminal;
   first voltage means for providing a voltage to the control terminal of the first amplifier;
   second voltage means for providing a voltage to the control terminal of the second amplifier;
   control means for providing a first current to the first voltage means and a second current to the second voltage means, said first and second currents each being predetermined functions of a difference of a voltage at the signal input terminal and a voltage at the signal output terminal; and
   means for connecting the signal input terminal to the control means, and to the first and second voltage means;
   wherein the voltage provided by the first voltage means varies in response to the voltage at the signal input terminal and to the first current, and wherein the voltage provided by the second voltage means varies in response to the voltage at the signal input terminal and to the second current.

10. The device of claim 9 wherein the first voltage means provides a voltage more positive than a voltage at the signal input terminal, and the second voltage means provides a voltage more negative than a voltage at the signal input terminal.

* * * * *